United States Patent
Herner et al.

(10) Patent No.: US 8,482,973 B2
(45) Date of Patent: *Jul. 9, 2013

(54) NONVOLATILE MEMORY CELL OPERATING BY INCREASING ORDER IN POLYCRYSTALLINE SEMICONDUCTOR MATERIAL

(75) Inventors: S. Brad Herner, San Jose, CA (US); Abhijit Bandyopadhyay, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/568,834

(22) Filed: Aug. 7, 2012

(65) Prior Publication Data

US 2012/0300533 A1 Nov. 29, 2012

Related U.S. Application Data

(60) Continuation of application No. 13/074,509, filed on Mar. 29, 2011, now Pat. No. 8,243,509, which is a division of application No. 11/148,530, filed on Jun. 8, 2005, now abandoned, which is a continuation-in-part of application No. 10/955,549, filed on Sep. 29, 2004, which is a continuation-in-part of application No. 10/855,784, filed on May 26, 2004, now Pat. No. 6,952,030, which is a continuation of application No. 10/326,470, filed on Dec. 19, 2002, now abandoned.

(51) Int. Cl.
*G11C 11/36* (2006.01)
*G11C 11/34* (2006.01)
*G11C 11/00* (2006.01)

(52) U.S. Cl.
USPC .................. 365/175; 365/148; 365/174

(58) Field of Classification Search
USPC ............................ 365/148, 174, 175
See application file for complete search history.

(56) References Cited

U.S. PATENT DOCUMENTS

| | | | |
|---|---|---|---|
| 4,499,557 | A | 2/1985 | Holmberg et al. |
| 4,646,266 | A | 2/1987 | Ovshinsky et al. |
| 4,665,428 | A | 5/1987 | Hockley et al. |
| 5,432,729 | A | 7/1995 | Carson et al. |
| 5,441,907 | A | 8/1995 | Sung et al. |
| 5,559,732 | A | 9/1996 | Birge |
| 5,700,737 | A | 12/1997 | Yu et al. |

(Continued)

FOREIGN PATENT DOCUMENTS

WO WO 2004/061851 7/2004

OTHER PUBLICATIONS

Office Action of related U.S. Appl. No. 10/955,549 mailed Sep. 19, 2012.

(Continued)

*Primary Examiner* — Ly D Pham
(74) *Attorney, Agent, or Firm* — Dugan & Dugan, PC (57) ABSTRACT

A memory cell is provided that includes a first conductor, a second conductor, and a semiconductor junction diode between the first and second conductors. The semiconductor junction diode is not in contact with a material having a lattice mismatch of less than 12 percent with the semiconductor junction diode. In addition, no resistance-switching element having its resistance changed by application of a programming voltage by more than a factor of two is disposed between the semiconductor junction diode and the first conductor or between the semiconductor junction diode and the second conductor. Numerous other aspects are provided.

20 Claims, 7 Drawing Sheets

U.S. PATENT DOCUMENTS

| | | | |
|---|---|---|---|
| 5,745,407 A | 4/1998 | Levy et al. |
| 5,751,012 A | 5/1998 | Wolstenholme et al. |
| 5,792,569 A | 8/1998 | Sun et al. |
| 5,835,396 A | 11/1998 | Zhang |
| 5,877,538 A | 3/1999 | Williams |
| 5,915,167 A | 6/1999 | Leedy |
| 5,991,193 A | 11/1999 | Gallagher et al. |
| 6,034,882 A | 3/2000 | Johnson et al. |
| 6,111,784 A | 8/2000 | Nishimura |
| 6,141,241 A | 10/2000 | Ovshinsky et al. |
| 6,185,122 B1 | 2/2001 | Johnson et al. |
| 6,236,587 B1 | 5/2001 | Gudesen et al. |
| 6,420,215 B1 | 7/2002 | Knall et al. |
| 6,483,736 B2 | 11/2002 | Johnson et al. |
| 6,525,953 B1 | 2/2003 | Johnson |
| 6,534,841 B1 | 3/2003 | Van Brocklin et al. |
| 6,567,301 B2 | 5/2003 | Anthony et al. |
| 6,584,029 B2 | 6/2003 | Tran et al. |
| 6,611,453 B2 | 8/2003 | Ning |
| 6,627,530 B2 | 9/2003 | Li et al. |
| 6,635,556 B1 | 10/2003 | Herner |
| 6,664,639 B2 | 12/2003 | Cleeves et al. |
| 6,677,220 B2 | 1/2004 | Van Brocklin et al. |
| 6,689,644 B2 | 2/2004 | Johnson |
| 6,693,823 B2 | 2/2004 | Brown |
| 6,784,517 B2 | 8/2004 | Kleveland et al. |
| 6,853,049 B2 | 2/2005 | Herner |
| 6,879,505 B2 | 4/2005 | Scheuerlein |
| 6,946,719 B2 | 9/2005 | Petti et al. |
| 6,951,780 B1 | 10/2005 | Herner |
| 6,952,030 B2 | 10/2005 | Herner et al. |
| 6,952,043 B2 | 10/2005 | Vyvoda et al. |
| 6,984,561 B2 | 1/2006 | Herner et al. |
| 7,026,212 B2 | 4/2006 | Herner et al. |
| 7,038,248 B2 | 5/2006 | Lee |
| 7,115,967 B2 | 10/2006 | Cleeves |
| 7,172,840 B2 | 2/2007 | Chen |
| 7,176,064 B2 | 2/2007 | Herner |
| 7,224,013 B2 | 5/2007 | Herner et al. |
| 7,238,607 B2 | 7/2007 | Dunton et al. |
| 7,265,049 B2 | 9/2007 | Herner et al. |
| 7,285,464 B2 | 10/2007 | Herner et al. |
| 7,307,013 B2 | 12/2007 | Raghuram et al. |
| 7,423,304 B2 | 9/2008 | Cleeves et al. |
| 7,474,000 B2 | 1/2009 | Scheuerlein |
| 7,511,352 B2 | 3/2009 | Vyvoda |
| 7,517,796 B2 | 4/2009 | Raghuram et al. |
| 7,557,405 B2 | 7/2009 | Herner et al. |
| 7,560,339 B2 | 7/2009 | Herner et al. |
| 7,767,499 B2 | 8/2010 | Herner |
| 8,243,509 B2 * | 8/2012 | Herner et al. ............... 365/175 |
| 2003/0025176 A1 | 2/2003 | Subramanian et al. |
| 2003/0164491 A1 | 9/2003 | Lee |
| 2005/0012119 A1 | 1/2005 | Herner et al. |
| 2005/0026334 A1 | 2/2005 | Knall |
| 2005/0052915 A1 | 3/2005 | Herner et al. |
| 2005/0098800 A1 | 5/2005 | Herner et al. |
| 2005/0221200 A1 | 10/2005 | Chen |
| 2005/0226067 A1 | 10/2005 | Herner et al. |
| 2006/0067117 A1 | 3/2006 | Petti |
| 2006/0249753 A1 | 11/2006 | Herner et al. |
| 2009/0261343 A1 | 10/2009 | Herner et al. |
| 2010/0181657 A1 | 7/2010 | Herner et al. |
| 2011/0176352 A1 | 7/2011 | Herner |
| 2011/0287615 A1 | 11/2011 | Herner |
| 2011/0318911 A1 | 12/2011 | Herner et al. |

OTHER PUBLICATIONS

Singh, D.V., et al., "Abrupt phosphorus profiles in Si: Effects of temperature and substitutional carbon on phosphorus autodoping", Journal of the Electrochemical Society, 150, (2003) G553-G556.

Written Opinion of International Application No. PCT/US2006/022023 mailed Sep. 21, 2006.

International Search Report of International Application No. PCT/US2006/022023 mailed Sep. 21, 2006.

International Preliminary Report on Patentability of International Application No. PCT/US2006/022023 issued Dec. 11, 2007.

Office Action of Europe Application No. 06 760 714.3 mailed Apr. 30, 2008.

Office Action and Search Report of Taiwan Application No. 095120206 issued Jun. 30, 2008.

Office Action of U.S. Appl. No. 10/955,549 mailed Jun. 27, 2006.

Final Office Action of U.S. Appl. No. 10/955,549 mailed Oct. 19, 2006.

Final Office Action of U.S. Appl. No. 10/955,549 mailed Sep. 24, 2007.

Aug. 4, 2006, Reply to Jun. 27, 2006 Office Action of U.S. Appl. No. 10/955,549.

Office Action of U.S. Appl. No. 11/015,824 mailed Dec. 14, 2006.

Notice of Allowance of U.S. Appl. No. 11/015,824 mailed Jun. 14, 2007.

Apr. 12, 2007 Reply to Dec. 14, 2006 Office Action of U.S. Appl. No. 11/015,824.

Office Action of U.S. Appl. No. 11/148,530 mailed Apr. 19, 2007.

Final Office Action of U.S. Appl. No. 11/148,530 mailed Nov. 23, 2007.

Office Action of U.S. Appl. No. 11/148,530 mailed Sep. 29, 2009.

Final Office Action of U.S. Appl. No. 11/148,530 mailed Apr. 30, 2009.

Jul. 30, 2009 Reply to Apr. 30, 2009 Final Office Action of U.S. Appl. No. 11/148,530.

Jan. 29, 2009 Reply to Sep. 29, 2008 Office Action of U.S. Appl. No. 11/148,530.

Aug. 20, 2007 Reply to Apr. 19, 2007 Office Action of U.S. Appl. No. 11/148,530.

Notice of Allowance of U.S. Appl. No. 11/215,951 mailed Apr. 25, 2007.

Office Action of U.S. Appl. No. 11/237,169 mailed Nov. 3, 2006.

Notice of Allowance of U.S. Appl. No. 11/237,169 mailed Mar. 26, 2007.

Akerman, "Toward a Universal Memory", Apr. 22, 2005, vol. 308, Science, 508-510.

Jan. 31, 2007 Reply to Nov. 3, 2006 Office Action of U.S. Appl. No. 11/237,169.

Examiner's Answer of U.S. Appl. No. 10/955,549 mailed Sep. 30, 2008.

Asuha, T. et al. "Ultrathin silicon dioxide layers with a low leakage current density formed by chemical oxidation of Si", Applied Physics Letters, vol. 81, No. 18 (Oct. 28, 2002), 3410-3412.

Babcock, J.A., et al., "Polysilicon Resistor Trimming for Packaged Integrated Circuits", IEDM 93, (1993),247-250.

Ellis, K. A. et al. "Phosphorus Diffusion in Silicon Oxide and Oxynitride Gate Dielectrics", Electrochem, Sol. St. Lett. 2, (1999), 516-518.

Feldbaumer, D.W. et al. "Theory and Application of Polysilicon Resistor Trimming", Solid-State Electronics, Vol. 38 11, (1995), 1861-1869.

Hamada, T. et al., "Thin Inter-Polyoxide Films for Flash Memories Grown at Low Temperature (400°) by Oxygen Radicals", IEEE Elect. Dev. Lett. vol. 22, No. 9, (Sep. 2001), 423-425.

Mahan, J. E. , "Threshold and Memory Switching in Polycrystalline Silicon", Applied Physics Letter, 41, 5. (Sep. 1982) 479-481.

Malhotra et al., "Fundamentals of Memory Switching in Vertical Polycrystalline Silicon Structures", IEEE Transactions on Electron Devices, ED-32 (11), 2441, (1985) (fr 086-A-4, 086-A-1 SPEC).

Malhotra, Vinod.,et al., "An Electrothermal Model of Memory Switching in Vertical Polycrystalline Silicon Structures", IEEE Transactions on Electron Devices, vol. 35, 9, (Sep. 1988), 1514-1523.

Nutzel, J.F., et al., "Comparison of P and Sb as n-dopants for Si molecular beam epitaxy", J. Appl. Phys. 78 (2), (Jul. 15, 1995), 937-940.

Park, B., et al., "Study of contact resistance in in-situ phosphorus layer doped Si deposition process", Electrochemical Society Proceedings 99-31, (1999), 34-45.

Raider, S. I. et al., "Abstract: Stoichiometry of SiO2/Si interfacial regions: I. Ultrathin oxide films", J. Vac. Sci. Tech. vol. 13, No. 1, (Jan./Feb. 1976), 58.

Office Action of U.S. Appl. No. 11/866,403 mailed Feb. 13, 2008.

Notice of Allowance of U.S. Appl. No. 11/866,403 mailed Aug. 14, 2008.
Notice of Allowance of U.S. Appl. No. 11/866,403 mailed Jan. 21, 2009.
Notice of Allowance of U.S. Appl. No. 11/866,403 mailed Apr. 22, 2009.
Jun. 13, 2008 Reply to Feb. 13, 2008 Office Action of U.S. Appl. No. 11/866,403.
Herner et al., U.S. Appl. No. 10/326,470, filed Dec. 19, 2002.
Office Action of U.S. Appl. No. 11/401,073 mailed Oct. 26, 2007.
Notice of Allowance of U.S. Appl. No. 11/401,073 mailed Sep. 23, 2008.
Notice of Allowance of U.S. Appl. No. 11/401,073 mailed Mar. 3, 2009.
Mar. 26, 2008 Reply to Oct. 26, 2007 Office Action of U.S. Appl. No. 11/401,073.
Dec. 1, 2008 Reply Brief of U.S. Appl. No. 10/955,549.
Jul. 3, 2008 Amended Appeal Brief of U.S. Appl. No. 10/955,549.
Jun. 4, 2008 Notification of Non-Compliant Appeal Brief of U.S. Appl. No. 10/955,549.
May 27, 2008 Appeal Brief of U.S. Appl. No. 10/955,549.
Apr. 17, 2007 Appeal Brief of U.S. Appl. No. 10/955,549.
Jun. 6, 2008 Pre-Brief Appeal Conference decision of U.S. Appl. No. 11/148,530.
Apr. 23, 2008 Pre-Appeal Brief Request for Review of U.S. Appl. No. 11/148,530.
Aug. 12, 2008 Reply to Jun. 12, 2008 *Ex Parte Quayle* Office Action of U.S. Appl. No. 11/401,073.
*Ex Parte Quayle* Office Action of U.S. Appl. No. 11/401,073 mailed Jun. 12, 2008.
Oct. 9, 2009 Office Action of related Chinese Application No. 200680027149.2.
Office Action of related U.S. Appl. No. 11/148,530 mailed Nov. 9, 2009.
Feb. 9, 2010 Reply to Nov. 9, 2009 Office Action of related U.S. Appl. No. 11/148,530.
Final Office Action of related U.S. Appl. No. 11/148,530 mailed Jun. 4, 2010.
Examiner's Interview Summary of related U.S. Appl. No. 11/148,530 mailed Aug. 2, 2010.
Aug. 31, 2010 Reply Jun. 4, 2010 Final Office Action and Interview Summary with Examiner of related U.S. Appl. No. 11/148,530.
Restriction Requirement of U.S. Appl. No. 12/477,216 mailed Sep. 8, 2010.
Sep. 24, 2010 Reply to Restriction Requirement of related U.S. Appl. No. 12/477,216 mailed Sep. 8, 2010.
Restriction Requirement of U.S. Appl. No. 12/481,684 mailed Oct. 18, 2010.
Nov. 2, 2010 Reply to Restriction Requirement of related U.S. Appl. No. 12/481,684 mailed Oct. 18, 2010.
Office Action of related U.S. Appl. No. 12/477,216 mailed Nov. 5, 2010.
Office Action of related U.S. Patent Appl. No. 12/481,684 mailed Dec. 8, 2010.
Office Action of related U.S. Appl. No. 11/148,530 mailed Dec. 14, 2010.
Restriction Requirement of U.S. Appl. No. 11/015,824 mailed Sep. 14, 2006.
Oct. 11, 2006 Reply to Restriction Requirement of U.S. Appl. No. 11/015,824 mailed Sep. 14, 2006.
Restriction Requirement of related U.S. Appl. No. 11/148,530 mailed Feb. 2, 2007.
Mar. 1, 2007 Reply to Restriction Requirement of related U.S. Appl. No. 11/148,530 mailed Feb. 1, 2007.
Restriction Requirement of related U.S. Appl. No. 11/401,073 mailed Sep. 12, 2007.
Oct. 12, 2007 Reply to Restriction Requirement of related U.S. Appl. No. 11/401,073 mailed Sep. 12, 2007.
Restriction Requirement of U.S. Appl. No. 10/955,549 mailed Mar. 17, 2006.
Apr. 7, 2006 Reply to Restriction Requirement of U.S. Appl. No. 10/955,549 mailed Mar. 17, 2006.
Restriction Requirement of U.S. Appl. No. 10/955,549 mailed Apr. 27, 2006.
May 22, 2006 Reply to Restriction Requirement of U.S. Appl. No. 10/955,549 mailed Apr. 27, 2006.
Interview Summary of U.S. Appl. No. 10/955,549 filed Oct. 16, 2007.
Feb. 7, 2011 Reply and Terminal Disclaimer to Nov. 5, 2010 Office Action of related U.S. Appl. No. 12/477,216.
Mar. 8, 2011 Reply to Dec. 8, 2010 Office Action of related U.S. Appl. No. 12/481,684.
Notice of Allowance of related U.S. Appl. No. 12/477,216 mailed Mar. 16, 2011.
Interview Summary of related U.S. Appl. No. 11/148,530 mailed Mar. 22, 2011.
Notice of Allowance of related U.S. Appl. No. 12/481,684 mailed May 11, 2011.
Notice of Abandonment of related U.S. Appl. No. 11/148,530 mailed Jun. 23, 2011.
Restriction Requirement of related U.S. Appl. No. 13/195,518 mailed Nov. 7, 2011.
Notice of Allowance of related U.S. Appl. No. 13/074,509 mailed Nov. 25, 2011.
Dec. 5, 2011 Response to Nov. 7, 2011 Restriction Requirement of related U.S. Appl. No. 13/195,518.
Office Action of related U.S. Appl. No. 13/195,518 mailed Feb. 15, 2012.
Notice of Allowance of related U.S. Appl. No. 13/228,109 mailed Feb. 15, 2012.
Notice of Allowance of related U.S. Appl. No. 13/228,109 mailed Apr. 3, 2012.
Notice of Allowance of related U.S. Appl. No. 13/074,509 mailed Apr. 12, 2012.
Decision on Appeal of related U.S. Appl. No. 10/955,549 mailed Apr. 27, 2012.
May 14, 2012 Terminal Disclaimer and Response to Feb. 15, 2012 Office Action of related U.S. Appl. No. 13/195,518.
Jun. 22, 2012 RCE and Response to Sep. 24, 2007 Final Office Action of related U.S. Appl. No. 10/955,549.
Notice of Allowance of related U.S. Appl. No. 13/195,518 mailed Jul. 10, 2012.
Notice of Allowance of related U.S. Appl. No. 13/195,518 mailed Oct. 23, 2012.
Dec. 19, 2012 Reply to Sep. 19, 2012 Office Action of related U.S. Appl. No. 10/955,549.
May 1, 2013 Reply to Feb. 1, 2013 Final Office Action of related U.S. Appl. No. 10/955,549.

* cited by examiner

NONVOLATILE MEMORY CELL OPERATING BY INCREASING ORDER IN POLYCRYSTALLINE SEMICONDUCTOR MATERIAL

RELATED APPLICATIONS

This application is a continuation of U.S. patent application Ser. No. 13/074,509, filed Mar. 29, 2011, now U.S. Pat. No. 8,243,509, which is a divisional of U.S. patent application Ser. No. 11/148,530, filed Jun. 8, 2005, now abandoned, which is a continuation-in-part of U.S. patent application Ser. No. 10/955,549, filed Sep. 29, 2004 and hereinafter the '549 application, which is a continuation-in-part of U.S. patent application Ser. No. 10/855,784, filed May 26, 2004, now U.S. Pat. No. 6,952,030, which is a continuation of U.S. patent application Ser. No. 10/326,470, filed Dec. 19, 2002 (now abandoned) and hereinafter the '470 application, all assigned to the assignee of the present invention and hereby incorporated by reference in their entirety.

BACKGROUND

The invention relates to a nonvolatile one-time-programmable memory cell.

Prior art nonvolatile memories, such as Johnson et al. U.S. Pat. No. 6,034,882, "Vertically Stacked Field Programmable Nonvolatile Memory and Method of Fabrication," have been based on a memory cell pairing a semiconductor junction diode with a dielectric antifuse layer, the diode and the dielectric antifuse layer disposed between conductors.

When the memory cell is formed, the dielectric antifuse layer (typically a layer of silicon dioxide) acts as an insulator, and when a read voltage is applied between the conductors, very little current flows between the conductors. When a sufficiently large voltage is applied between the conductors, however, the dielectric antifuse layer suffers dielectric breakdown and ruptures, and a permanent conductive path is formed through the dielectric antifuse layer.

In a programmed cell, when a read voltage is applied between conductors, a significantly higher current flows than in the unprogrammed cell, allowing the unprogrammed and programmed cells to be distinguished. The memory state is stored in the state of the dielectric antifuse layer, which may be intact or ruptured.

Memory cells based on rupture of a dielectric antifuse layer, however, suffer some disadvantages. If the dielectric antifuse layer is too thin, leakage current can be a severe problem. Disturb can also be a problem: every time the memory cell is read, the dielectric antifuse layer is exposed to some stress, and may eventually break down and be inadvertently programmed. This is avoided by making the dielectric antifuse layer thicker, but a thicker dielectric antifuse layer requires higher programming voltage to rupture.

Higher voltages in electronic devices, for example in portable devices, are generally disadvantageous. If the dielectric antifuse layer is an oxide layer formed by oxidation, a thicker antifuse layer calls for either higher temperatures or slower fabrication time, both disadvantageous in forming a commercial device.

There is a need, therefore, for a one-time programmable memory cell which does not rely on rupture of a dielectric antifuse layer.

SUMMARY

The present invention is defined by the following claims, and nothing in this section should be taken as a limitation on those claims. In general, the invention is directed to a nonvolatile memory cell comprising a diode, the memory state stored in the state of the diode.

A first aspect of the invention provides for a nonvolatile memory cell including: a first conductor; a diode comprising amorphous or polycrystalline semiconductor material; and a second conductor, the semiconductor diode disposed between the first conductor and the second conductor, wherein before application of a programming voltage the diode has a first maximum barrier height, and after application of the programming voltage the diode has a second maximum barrier height, the second maximum barrier height at least 1.5 times the first maximum barrier height.

Another aspect of the invention provides for a nonvolatile memory cell including: a first conductor; a second conductor; and a polycrystalline semiconductor junction diode disposed between the first and second conductors, wherein a data state of the memory cell is determined by a state of an antifuse, and wherein the polycrystalline semiconductor junction diode is the antifuse.

Yet another aspect of the invention provides for a method for forming and programming a nonvolatile memory cell, the method including: forming a first conductor; forming a second conductor; depositing and doping semiconductor material to form a semiconductor junction diode, the semiconductor junction diode disposed between the first and second conductors; crystallizing the semiconductor material such that the semiconductor junction diode is polycrystalline, wherein, during the crystallizing step, the semiconductor material is not in contact with a template material having a lattice mismatch of less than 12 percent with the semiconductor material; and programming the memory cell by applying a programming voltage between the first and second conductors, wherein no resistance-switching element having its resistance changed by application of the programming voltage by more than a factor of two is disposed between the semiconductor junction diode and the first conductor or between the semiconductor junction diode and the second conductor.

A preferred embodiment of the invention provides for a monolithic three dimensional memory array including: a) a first memory level above a substrate, the first memory level comprising: i) a first plurality of substantially parallel conductors; ii) a second plurality of substantially parallel conductors above the first conductors; iii) a first plurality of semiconductor junction diodes, each first diode disposed between one of the first conductors and one of the second conductors; and iv) a first plurality of one-time-programmable memory cells, each first memory cell adapted to be programmed by application of a programming voltage, each memory cell comprising a portion of one of the first conductors, a portion of one of the second conductors, and one of the first diodes, wherein before programming, each first diode has a first maximum barrier height, and after programming, each first diode has a second maximum barrier height, the second maximum barrier height at least 1.5 times the first maximum barrier height; and b) a second memory level monolithically formed above the first memory level.

Another preferred embodiment of the invention provides for a monolithic three dimensional memory array including: a) a first memory level comprising: i) a plurality of bottom conductors; ii) a plurality of top conductors; and iii) a plurality of first polycrystalline semiconductor junction diodes, each diode disposed between one of the bottom and one of the top conductors; and iv) a first memory cell comprising one of the first diodes, wherein the data state of the first memory cells is determined by the state of an antifuse, and wherein the diode of the first memory cell is the antifuse; and b) a second memory level monolithically formed above the first memory level.

A final aspect of the invention provides for a nonvolatile memory cell including: a first conductor; a diode comprising amorphous or polycrystalline semiconductor material; and a second conductor, the semiconductor diode disposed between the first conductor and the second conductor, wherein before application of a programming voltage the diode has a first rectification ratio at a read voltage between about 0.5 and about 2.5 volts, and after application of the programming voltage the diode has a second rectification ratio at the read voltage, the second rectification ratio at least 10 times the first rectification ratio.

Each of the aspects and embodiments of the invention described herein can be used alone or in combination with one another.

The preferred aspects and embodiments will now be described with reference to the attached drawings.

DETAILED DESCRIPTION

Figure 1:
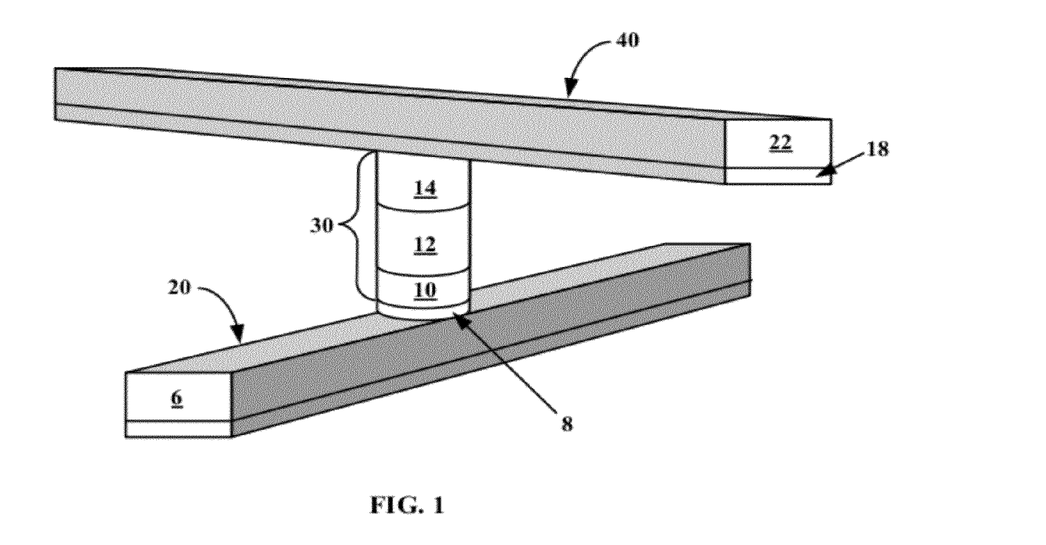
FIG. 1 is a perspective view of a memory cell formed according to the present invention.

A preferred embodiment of a memory cell described in the '549 application is shown in FIG. 1. A diode 30 is disposed between a bottom conductor 20 and a top conductor 40. Diode 30 is in electrical contact with bottom conductor 20 and top conductor 40, with no dielectric layer interposed between them. Titanium nitride layer 8 is a conductive barrier layer to prevent reaction between tungsten layer 6 and the silicon of diode 30. Titanium nitride layer 18 serves as an adhesion layer and as a barrier layer between diode 30 and tungsten layer 22.

In preferred embodiments of the '549 application, the diode was formed by depositing and doping a silicon layer stack and patterning and etching the layer stack to form a pillar. Regions of the layer stack were doped (by in situ doping or by ion implantation) to form a p-i-n diode; in a preferred embodiment bottom region 10 was heavily doped n-type silicon, middle region 12 was intrinsic, undoped silicon, and top region 14 was heavily doped p-type silicon.

This diode is a form of semiconductor junction diode; this term refers to a semiconductor device with the property of conducting current more easily in one direction than the other, having two terminal electrodes, and made of semiconducting material which is p-type at one electrode and n-type at the other. After formation of top conductor 40, the silicon of diode 30 was annealed (either in a separate anneal step or during subsequent thermal processing) to fully crystallize it. In preferred embodiments of the completed device of the '549 application, diode 30 is polycrystalline.

Figure 2:
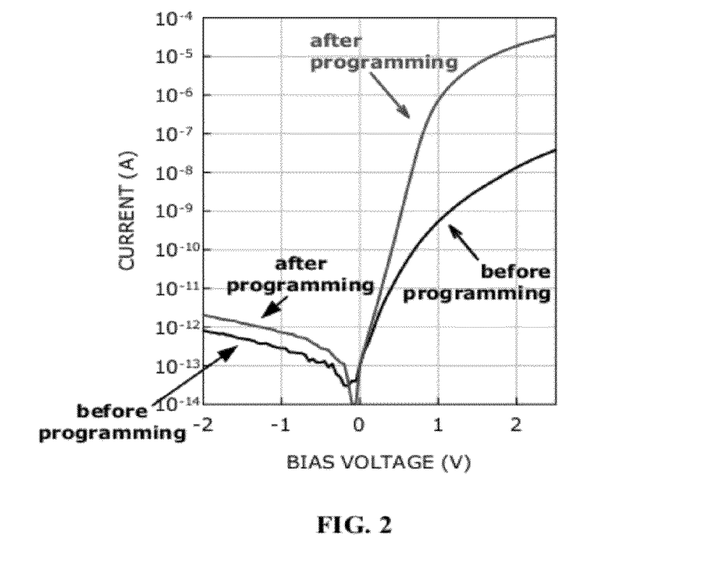
FIG. 2 is a graph showing I-V curves for an unprogrammed cell and a programmed cell formed like the cell of FIG. 1.

As formed, diode 30 has an I-V curve like the curve labeled "before programming) in the graph of FIG. 2, allowing little current to flow when a typical read voltage, for example 2 volts, is applied between bottom conductor 20 and top conductor 40. It was found that applying a programming voltage of, for example, about 8 volts between bottom conductor 20 and top conductor 40 permanently changes diode 30.

The I-V curve labeled "after programming" in FIG. 2 shows current for the diode after programming. After programming, current increases sharply as the turn-on voltage is reached, and the programmed diode allows significantly more current to flow when a read voltage of 2 volts is applied between bottom conductor 20 and top conductor 40. The difference in current flow at an applied read voltage allows a programmed cell to be distinguished from an unprogrammed cell, and thus for the cell to store a memory state (data "0" or data "1", for example.) This cell does not include a dielectric antifuse layer.

A material exhibiting ohmic behavior conducts with equal ease in both directions, and current increases linearly with voltage. A diode exhibits non-ohmic behavior: It conducts current more easily in one direction than the other, and has a non-linear relationship between voltage and current, as shown in FIG. 2. One measure of the effectiveness of a diode is its barrier height over a range of applied voltages.

Figure 3:
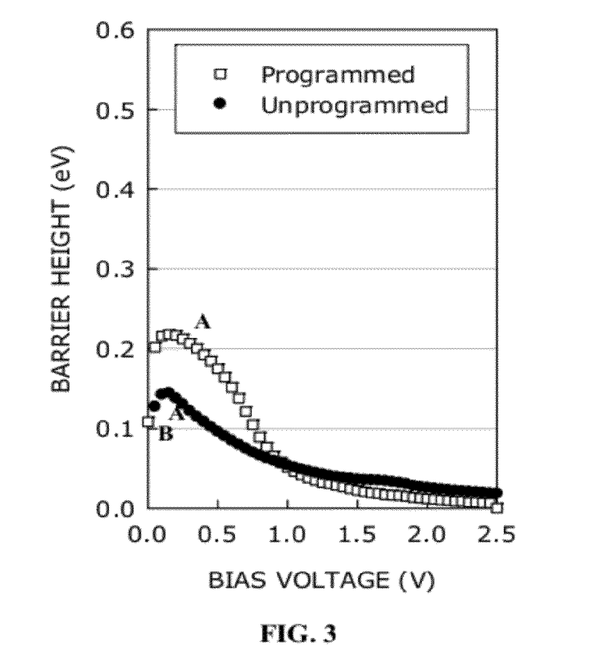
FIG. 3 is a graph showing barrier height between 0 and 2.5 bias volts for a programmed and an unprogrammed memory cell formed according to the present invention.

In an ideal diode, the barrier height (roughly speaking, the barrier to current flow) is high at very low voltage, between about 0 and 0.2 volts, drops abruptly as the turn-on voltage is approached, and is very low above the turn-on voltage. FIG. 3 shows the barrier height of the diode of FIG. 1 before and after programming at an applied bias ranging from 0 to 2.5 volts. The maximum barrier height of a programmed diode (curve A in FIG. 3) is 0.218 electron-volts, nearly twice the maximum barrier height of an unprogrammed diode (curve B), which is 0.144 electron-volts.

The memory cell of the present invention is a nonvolatile memory cell comprising: a first conductor; a diode comprising amorphous or polycrystalline semiconductor material; and a second conductor, the semiconductor diode disposed between the first conductor and the second conductor, wherein before application of a programming voltage the diode has a first maximum barrier height, and after application of the programming voltage the diode has a second maximum barrier height, the second maximum barrier height at least 1.5 times the first maximum barrier height, in some embodiments 1.7 times the first maximum barrier height.

Figure 4:
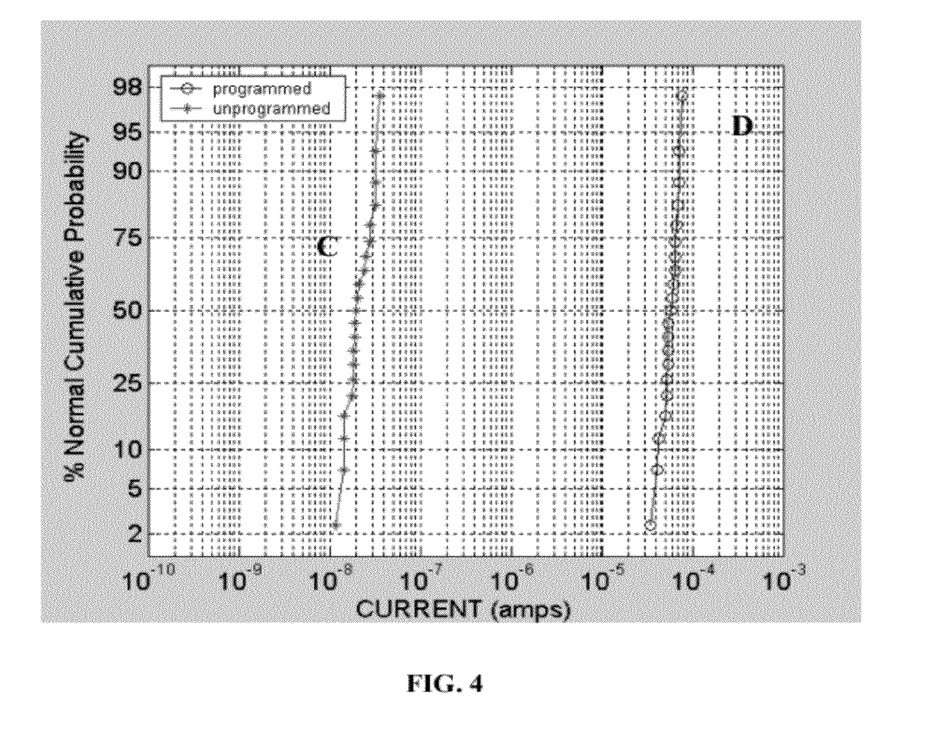
FIG. 4 is a graph showing unprogrammed and programmed current for a cell according to the present invention at an applied read voltage.

Read voltages are selected to be well above the turn-on voltage, which for silicon is theoretically at a bias voltage of 1.1 volts. As shown in FIG. 3, at voltages used for read, for example at 2.0 volts, the barrier height of a programmed diode is significantly less than that of an unprogrammed diode. Turning to FIG. 4, which is a probability plot showing current for a distribution of programmed and unprogrammed diodes, the median current for unprogrammed cells (curve C) at 2 volts is $1.2 \times 10^{-8}$ amps, while the median current for programmed cells (curve D) at 2 volts is $4.8 \times 10^{-5}$ amps, a difference of more than three orders of magnitude.

As described, a diode allows current to flow more easily in one direction than in the opposite direction; the diode is said to be rectifying. More current will flow through a diode when the diode is positively biased at a given voltage, for example 2 volts, than when the diode is negatively biased at the same voltage. The ratio of these currents is the rectification ratio and is another measure of diode quality.

The diodes of the present invention show a large increase in rectification ratio after programming. When silicon diodes formed according to the present invention were measured using a voltage sweep, current through an unprogrammed diode at −2 volts was about $8.1 \times 10^{-13}$ amps, as compared to a current under positive bias of 2 volts of about $1.3 \times 10^{-8}$ amps, yielding a rectification ratio at 2 volts of about $1.6 \times 10^4$.

In the same population of diodes, current through the programmed diode at −2 volts was about $2.0 \times 10^{-12}$ amps, while the current for programmed cells at 2 volts was about $1.8 \times 10^{-5}$ amps, for a rectification ratio at two volts of about $9.2 \times 10^6$. In this example, the rectification ratio of a diode of the present invention after programming was about 575 times greater than its rectification ratio before programming.

When the diode is silicon, a programmed diode of the present invention will have a rectification ratio at 2 volts at least 100 times the rectification ratio at 2 volts of the unprogrammed diode. In less preferred embodiments, the rectification ratio at 2 volts will be at least 10 times higher after programming than before programming. For silicon, rectification ratio at 2 volts has been discussed. Two volts was selected because it is an advantageous read voltage.

At positive voltage, an I-V curve for a diode has a characteristic shape: It is initially very low, rises abruptly as the turn-on voltage is reached, then stabilizes above the turn-on voltage. Two volts is an advantageous read voltage in the present invention because it is in the stable part of the curve, above the turn-on voltage. More generally, the diode of the present invention shows a large increase in rectification ratio, at least 10 times, in preferred embodiments 100 times, at a read voltage. A read voltage is a voltage in the stable part of the curve, above the diode's turn-on voltage. Read voltages for silicon may range between about 1.5 volts and about 2.5 volts.

For germanium diodes, an appropriate read voltage will be lower, between about 0.5 volts and about 2.0 volts, preferably about 1.2 volts. Semiconductor diodes formed of alloys comprising silicon and germanium will have intermediate read voltages, depending on the relative compositions of silicon and germanium, and will be between about 1.2 and about 2.0 volts.

Memory cells formed according to the present invention having diodes formed of germanium or semiconductor alloys comprising silicon and germanium will have a first rectification ratio before programming and a second rectification ratio after programming, the second rectification ratio at least 10 times the first rectification ratio, and in preferred embodiments at least 100 times the first rectification ratio.

Many factors can affect the quality of a diode, including dopant concentration, doping profiles, dopant activation, and degree of crystallinity and of crystalline defects. It is believed that in the present invention, programming changes the diode by increasing the degree of order of crystallinity of the semiconductor material of the diode.

Figure 5:
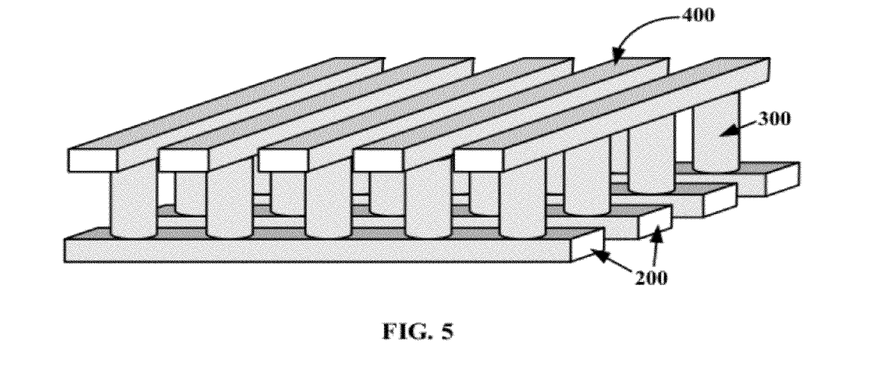
FIG. 5 is a perspective view of a memory level according to the present invention.

FIG. 5 shows a memory level of exemplary memory cells formed according to the present invention, including bottom conductors 200, pillars 300 (each pillar 300 comprising a diode), and top conductors 400. Fabrication of this memory level will be described. More detailed information regarding fabrication of such a memory level is provided in the '470 and '549 applications, previously incorporated.

Additional information is found in Herner et al. U.S. patent application Ser. No. 11/015,824, "Nonvolatile Memory Cell Comprising a Reduced Height Vertical Diode," filed Dec. 17, 2004; Herner et al. U.S. patent application Ser. No. 11/125,606, "High-Density Nonvolatile Memory Array Fabricated at Low Temperature Comprising Semiconductor Diodes," filed May 9, 2005; and Herner et al. U.S. patent application Ser. No. 10/954,577, "Junction Diode Comprising Varying Semiconductor Compositions," filed Sep. 29, 2004 and hereinafter the '577 application, all owned by the assignee of the present invention and hereby incorporated by reference. To avoid obscuring the invention, not all of this detail will be included in this description, but no teaching of these or other incorporated patents and applications is intended to be excluded.

Figure 6A:
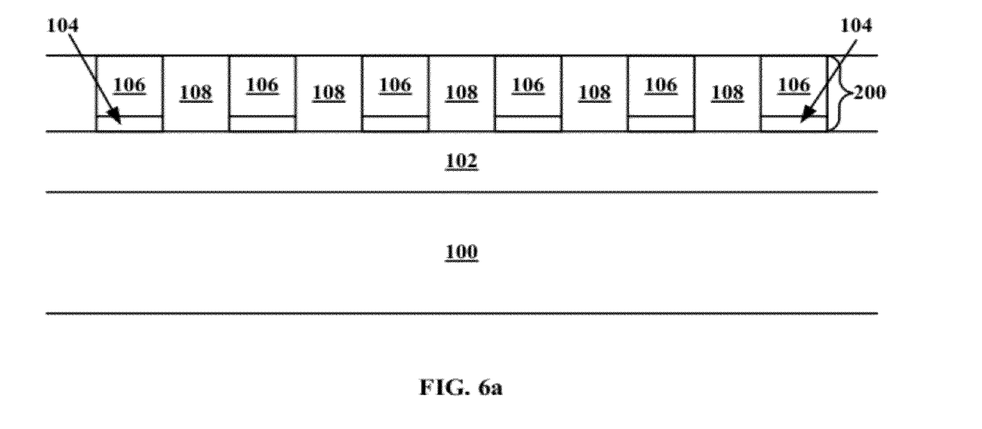
FIGS. 6a-6c are cross-sectional views showing stages in formation of a memory level according to the present invention.

Turning to FIG. 6a, fabrication of a memory level comprising memory cells formed according to the present invention begins over a suitable substrate 100, for example a monocrystalline semiconductor wafer substrate. Circuitry, such as sense amplifiers and drivers, can be formed in substrate 100 before fabrication of the memory level begins. An insulating layer 102 is formed above substrate 100.

Conductive layers 104 and 106 are deposited. Layer 104 is an adhesion layer, preferably of titanium nitride. Layer 106 is a conductive material, for example tungsten. Other conductive materials may be preferred. Layers 104 and 106 are patterned and etched to form substantially parallel, substantially coplanar rail-shaped bottom conductors 200, shown here in cross-section extending out of the page.

A dielectric material 108 is deposited over and between conductors 200, filling gaps between them. A planarizing step, for example by chemical mechanical polishing (CMP), exposes tops of conductors 200 and creates a substantially planar surface.

Figure 6B:
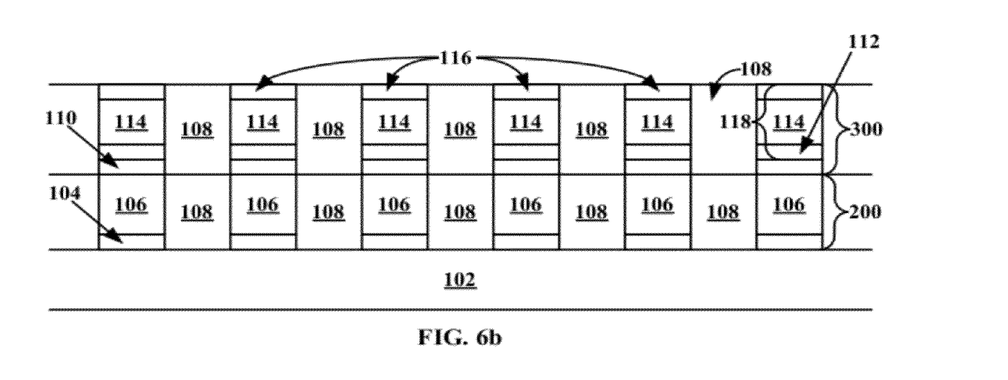

Turning to FIG. 6b, next a barrier layer 110 is deposited. (To save space, substrate 100 is omitted from FIG. 6b; its presence should be assumed in this and subsequent figures.) This layer is preferably about 200 angstroms thick, and provides a chemical barrier between the conductive layer 106 and the semiconductor material to be deposited next. Barrier layer 110 is preferably titanium nitride, though other appropriate barrier materials, for example tantalum nitride, tantalum, titanium tungsten, tungsten nitride, or tungsten, could be used instead.

The diode to be formed will be a vertically oriented p-i-n diode, having a heavily doped p-type region at one end, an intrinsic middle region (not intentionally doped), and a heavily doped n-type region at the other end. In this example, the bottom region will be heavily doped n-type, the middle region will be intrinsic, and the top region will be heavily doped p-type. The conductivity types could be reversed if desired. Using conventional deposition techniques, intrinsic silicon (deposited with no dopants) has defects which tend to make it behave as if it were lightly doped with n-type dopants. If desired, this region could be lightly doped.

A semiconductor layer stack is deposited on barrier layer 110. The semiconductor material can be silicon, germanium, a silicon-germanium alloy, or any semiconductor alloy including silicon and/or germanium. In some embodiments, different parts of the layer stack comprise different semiconductor materials or alloys, as in the '577 application.

In this example the semiconductor material is silicon, and bottom region 112 is heavily doped with an n-type dopant, for example phosphorus or arsenic, preferably by in situ doping. The silicon that will make up the rest of the diode, regions 114 and 116, is deposited next. The thickness of silicon that will form regions 114 and 116 is preferably deposited undoped. The top heavily doped p-type region 116 could be formed during deposition by in situ doping, but in preferred embodiments will be doped in a later implant step.

Silicon regions 116 (not yet doped), 114 and 112 and barrier layer 110 are patterned and etched to form pillars 300. The photolithography techniques described in Chen U.S. patent application Ser. No. 10/728,436, "Photomask Features with Interior Nonprinting Window Using Alternating Phase Shifting," filed Dec. 5, 2003; or Chen U.S. patent application Ser. No. 10/815,312, Photomask Features with Chromeless Nonprinting Phase Shifting Window," filed Apr. 1, 2004; and in Raghuram et al. U.S. patent application Ser. No. 11/061,952, "Method for Patterning Submicron Pillars," filed Feb. 17, 2005, all three owned by the assignee of the present invention and hereby incorporated by reference, can advantageously be used to perform any photolithography step used in formation of a memory array according to the present invention.

Dielectric material 108 is deposited over and between pillars 300, filling gaps between them. A planarizing step, for example by CMP, exposes tops of pillars 300 and forms a substantially planar surface. After this CMP step, heavily doped p-type region 116 is preferably formed at the tops of pillars 300 by ion implantation of a p-type dopant, for example boron or $BF_2$. Diodes 118, which are p-i-n diodes, have been formed.

The height (silicon thickness) of completed diodes 118 can range from about 800 to about 4000 angstroms. (Some silicon thickness may be lost during the planarizing step; an extra thickness should be deposited to compensate.) Intrinsic region 114 can be from about 600 to about 3500 angstroms thick. The structure at this point is shown in FIG. 6b.

Figure 6C:
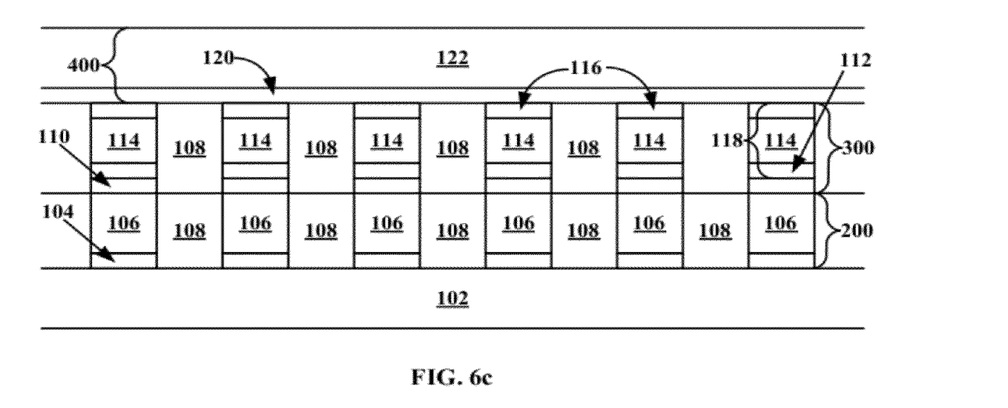

Turning to FIG. 6c, adhesion layer 120 and conductive layer 122 are deposited next. Adhesion layer 120 is preferably any of the materials used for barrier layer 110, for example titanium nitride. Conductive layer 122 can be any appropriate conductive material, for example tungsten. Layers 120 and 122 are patterned and etched to form substantially parallel, substantially coplanar top conductors 400. Bottom conductors 200 extended in a first direction; top conductors 400 extend in a second direction different from the first direction, preferably perpendicular to it. Each diode 118 is vertically disposed between one of bottom conductors 200 and one of top conductors 400.

What has been formed, shown in FIG. 6c, is a first memory level. An interlevel dielectric can be formed above this first memory level, planarized, and a second memory level can be fabricated on this planarized dielectric surface as described. Multiple memory levels of the same type can be monolithically formed above the same substrate, each fabricated on a prior memory level, to form a monolithic three dimensional memory array like those described in the '549 and '470 applications.

Each memory cell will be programmed by applying a programming voltage between about 3 and about 15 volts, preferably between about 6 and about 10 volts, preferably between about 7 and about 9 volts, for example about 8 volts. The programming voltage selected will depend on a variety of factors, including the volume of each diode, initial defect density, dopant profile, and the semiconductor material used to form the diodes. The read voltage will also vary, from about 0.5 to about 3 volts, for example between about 1 and about 2.5 volts, for example about 2 volts.

Figure 7:
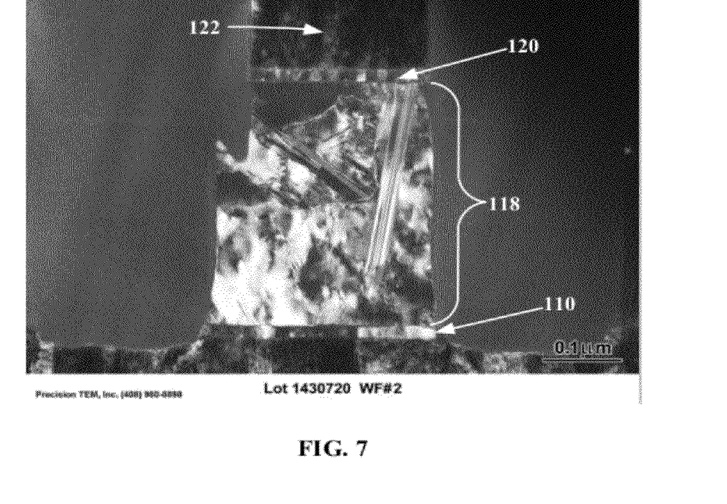
FIG. 7 is a dark field TEM image showing crystal defects in silicon in a memory cell according to the present invention, shown in cross-section.

When the silicon that makes up diode 118 is deposited, it is generally amorphous, and crystallizes during a later crystallization step. FIG. 7 is a dark field transmission electron microscope (TEM) image of an unprogrammed cell formed according to the present invention, with titanium nitride layer 110, diode 118, titanium nitride layer 120, and conductive layer 122 labeled. The view of FIG. 7 is at ninety degrees to the view of FIG. 6a.

FIG. 7 shows that the resulting diode is polycrystalline, and typically has defects, including grain boundaries, dislocations, and twins, which are clearly visible. It is known that such defects can impede flow of charge carriers and decrease dopant activation, degrading device performance. Conventional semiconductor devices are generally formed in a monocrystalline silicon wafer surface rather than in polycrystalline silicon for this reason, and result in higher quality devices. In this discussion, polycrystalline silicon will be called polysilicon.

An alternative method of forming a memory cell having a vertical p-i-n diode formed of deposited and crystallized silicon is disclosed in Petti, U.S. application Ser. No. 10/955,387, "Fuse Memory Cell Comprising a Diode, the Diode Serving as the Fuse Element," filed Sep. 29, 2004, hereinafter the '387 application, owned by the assignee of the present invention and hereby incorporated by reference.

Figure 8A:
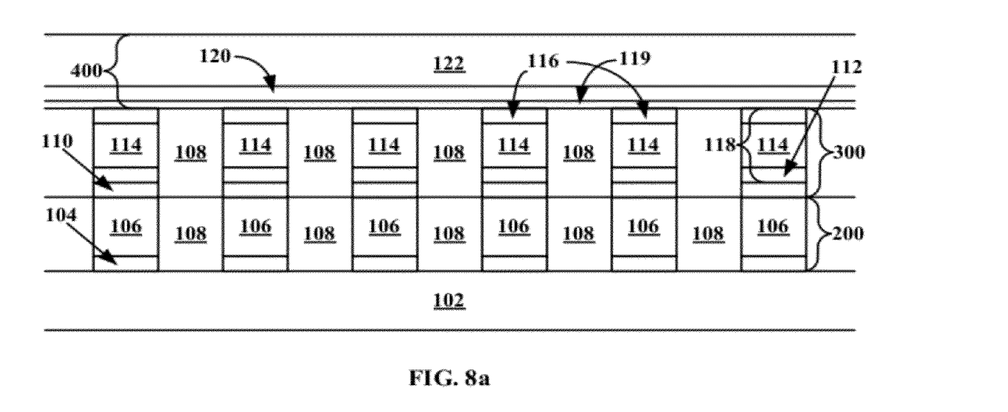
FIGS. 8a-8b are cross-sectional views showing stages in formation of a memory level with a silicide contact described in U.S. patent application Ser. No. 10/955,387.

In one embodiment, a memory level of these cell is formed as described in FIGS. 6a-6c, except, as shown in FIG. 8a, a thin layer 119 of titanium is deposited before titanium nitride layer 120. During an anneal step, where titanium layer 119 is in contact with pillars 300, it reacts with the silicon of heavily doped regions 116 to form titanium silicide contacts 121 in FIG. 8b. For simplicity, in FIG. 8b, titanium silicide contacts 121 are depicted as a continuous layer spanning each diode, but they may not actually take this form, and may form one or more discontinuous islands instead.

Figure 8B:
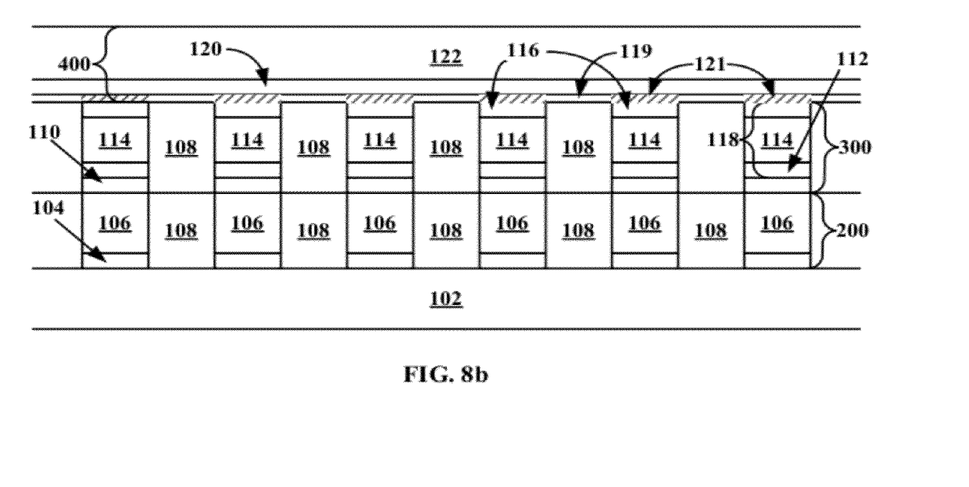
Figure 9:
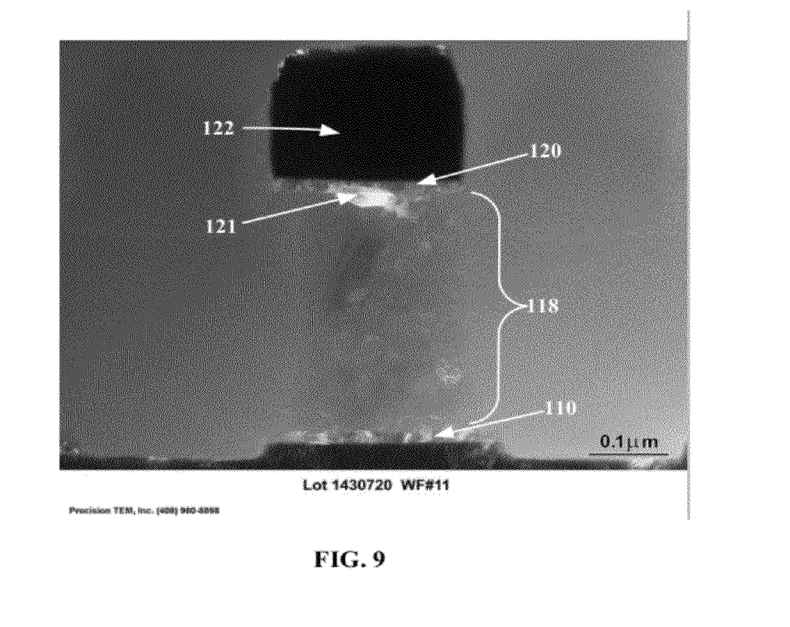
FIG. 9 is a dark field TEM image showing relatively defect-free silicon in the memory cell described in U.S. patent application Ser. No. 10/955,387, shown in cross-section.

A resulting diode formed as in FIG. 8b is shown in a dark field TEM image in FIG. 9. The view of FIG. 9 is at ninety degrees to the view of FIG. 8b. Titanium silicide contact 121 does not form a continuous layer across the diode 118. The cell shown in FIG. 9 has far fewer defects and grain boundaries than the cell shown in FIG. 7. This diode has a more highly ordered degree of crystallinity. The barrier height of a cell having a titanium silicide contact is shown at bias voltages from 0 to 2.5 volts in FIG. 10. The barrier height curve shown by FIG. 10 is for the titanium-silicide-contact diode as formed, before the cell is subjected to a programming voltage.

Figure 10:
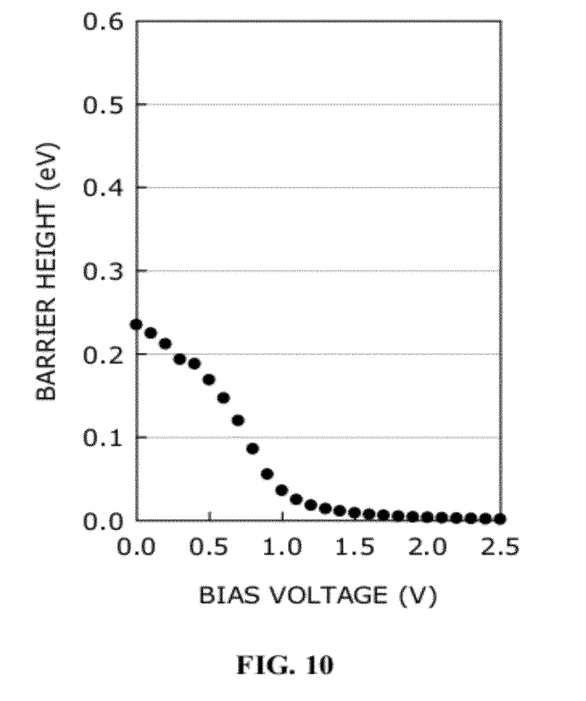
FIG. 10 is a graph showing barrier height between 0 and 2.5 bias volts for a memory cell described in U.S. patent application Ser. No. 10/955,387.

Recall that the diode of FIG. 7 (of the present invention), with its barrier height before and after programming shown in FIG. 3, is formed with the semiconductor material contacting titanium nitride layer 110 and 120 (or another of the named barrier materials) at its top and bottom ends, while the diode of FIG. 9 (of the '387 application), its barrier height shown in FIG. 10, contacts titanium nitride layer 110 at its bottom end and titanium silicide contact 121 at its top end.

In comparing FIG. 3 and FIG. 10, it is evident that the barrier height of the silicide-contact diode as formed strongly resembles that of the titanium-nitride-contact diode of the present invention after programming (curve A). The maximum barrier height of the silicide-contact diode of FIG. 9 is 0.235, close to 0.218, the maximum barrier height of the programmed titanium-nitride contact diode.

Unlike the titanium-nitride-contact diode, when the silicide-contact diode of FIG. 9 is exposed to a programming voltage, for example of about 8 volts, the barrier height and current flow with applied read voltage are not appreciably changed. The silicide-contact diode is essentially a programmed diode as formed.

The difference between the titanium-nitride-contact diode, which has high defect density, and the silicide-contact diode, which is nearly defect-free, is believed to be due to the presence of titanium silicide during crystallization of the silicon that makes up the diode.

As described earlier, the silicon that forms the diodes of both FIG. 7 and FIG. 9 is generally amorphous as deposited, and crystallizes after the top and bottom conductors have been formed. Thus when the silicon of FIG. 7 crystallizes, it is in contact with titanium nitride layers 110 and 120 and with surrounding dielectric fill, generally silicon dioxide. When the silicon of FIG. 9 crystallizes, it is in contact with titanium nitride layer 110, surrounding silicon dioxide, and top titanium silicide contact 121.

Titanium nitride and titanium silicide each has a characteristic lattice structure. The lattice spacing of the most likely orientation of titanium nitride at the surface which will contact the silicon of the diode is 2.510 angstroms. A lattice spacing of titanium silicide in contact with silicon is 3.319 angstroms. The lattice spacing of silicon at its predominant orientation is 3.316 angstroms.

At the interface, titanium nitride and silicon have a large lattice mismatch, 22.8 percent, while the lattices of titanium silicide and silicon are much more closely matched, with a lattice mismatch of only 1.7 percent. (This mismatch is for a lattice spacing of C49-phase titanium silicide rather than C54-phase titanium silicide. The C49-to-C54 phase transition has been shown to be difficult to achieve in features having line widths less than 250 nm.

The diodes are isolated structures formed at even smaller dimension, so it is expected that titanium silicide in the diodes is C49 phase rather than C54 phase. Titanium silicide contacts 121 in FIG. 8b were formed by reacting titanium layer 119 with silicon layer 116. This silicide reaction happens at a temperature lower than the temperature at which amorphous silicon begins to crystallize, so titanium silicide contacts 121 are present before significant crystallization of the silicon begins.

It is believed that C49 titanium silicide contact 121 provides a good crystallization template for the silicon of the diode 118 as it crystallizes, leading to low defect density in the diode of FIG. 8b, as is evident in the TEM image of FIG. 9. In contrast, in the diode of the present invention (in FIG. 6c and FIG. 7), no titanium silicide lattice is present, only titanium nitride.

The high lattice mismatch between titanium nitride (for the expected orientation) and silicon puts severe strains on the silicon lattice as it forms. For a very thin layer of silicon, high strain can be tolerated. The combined thickness of silicon layers 112, 114, and 116, however, is between about 800 and over 4000 angstroms, too thick to sustain such strain, and defects such as those apparent in the TEM image of FIG. 7 are generated.

In the present invention, then, a diode is formed having a certain defect density, which in its initial, unprogrammed state, causes the diode to have poor conductivity and low rectification ratio, and to permit a small current flow when a read voltage is applied. Application of a programming pulse improves conductivity, permanently improving the rectification ratio of the diode, so that when the same read voltage is applied, a much larger current flows. The diode remains a diode after programming, exhibiting non-ohmic conduction.

When a read voltage is applied, the programmed current is preferably at least an order of magnitude greater than the unprogrammed current, most preferably at least two or three orders of magnitude greater. In this way the diode can store a memory state, and can behave as a nonvolatile, one-time-programmable memory cell. Diodes according to the present invention can also be formed of silicon-germanium alloys, germanium and other semiconductor alloys comprising germanium and/or silicon.

To store a memory state and function effectively as a memory cell, then, the diode is preferably formed with a certain advantageous defect density. In the example given, the defect density was achieved by crystallizing silicon in contact with a crystallization template apparently provided by adjacent titanium nitride contacts, and, more specifically, not in contact with a template material having a very small lattice mismatch, such as C49 phase titanium silicide.

More generally, to form a memory cell which has a diode with the preferred defect density, it should be formed of a semiconductor material which, during crystallization, is not in contact with a template material having a lattice mismatch of less than about 3 or 4 percent with the semiconductor material. Preferably the semiconductor material, when crystallized, is not in contact with a template material having a lattice mismatch of less than about 12 percent with the semiconductor material.

If the semiconductor material is silicon, then, it should be crystallized not in contact with materials like titanium silicide, cobalt silicide, or nickel monosilicide (NiSi) which can have very small lattice mismatches with silicon. Many materials having an advantageous mismatch with silicon are known; among preferred materials for top and bottom contacts are titanium nitride, tantalum nitride, tantalum, titanium tungsten, tungsten nitride, or tungsten.

These materials not only provide the necessary large lattice mismatch, but also are compatible with the device, as they are thermally compatible with silicon and can serve as relatively effective barrier materials. These materials also provide sufficient lattice mismatch for use with germanium, a silicon-germanium alloy, or most semiconductor alloys including silicon and/or germanium.

The phenomenon of changing the resistivity of polysilicon by subjecting it to a programming voltage has been described, for example in Malhotra et al., "Fundamentals of Memory Switching in Vertical Polycrystalline Silicon Structures," IEEE Transactions on Electron Devices, ED-32 (11), 2441 (1985). In one study, large features, for example 1 micron in width, were formed of polysilicon having a relatively high resistivity, which were then exposed to a high-voltage pulse. After the voltage pulse was applied, a low-resistivity filament was formed through the polysilicon.

In the present invention, in preferred embodiments, the diameter of a diode in a memory cell like those of FIGS. 7 and 9 is very small, between about 45 nm and about 150 nm. The low-resistivity filaments observed by Malhotra et al. were substantially larger in diameter than the diodes of the present invention. It is expected that, due to the small diameter of the diodes of the present invention, no filament is formed, and that instead the entire volume of the diode experiences a high-resistivity-to-low-resistivity change.

Changing resistivity in polysilicon has been observed in polysilicon resistors. In a memory like that of the present invention, however, it is highly advantageous that diodes, rather than resistors, be formed between conductors. In a large memory array, with many cells on a bit line or a word line, when voltage is applied across a specific cell, neighboring cells may also be exposed to some voltage, possibly resulting in inadvertent programming of those cells. Leakage current across unselected cells is also a problem, increasing power consumption. The non-ohmic conduction characteristics of diodes allow for better electrical isolation of a cell from cells sharing one of its conductors, and thus a more robust memory array with lower power consumption.

The conversion of the semiconductor material making up the diode of the present invention is likely a thermal phenomenon. When a programming voltage is applied to a typical unprogrammed diode, resistance is initially relatively high, then drops very quickly, in a matter of nanoseconds, and then remains low. It is likely that during this brief programming time, some portion of the semiconductor material melts. The molten semiconductor material is highly conductive and presents very little resistance. The temperature of the semiconductor material decreases and the semiconductor material is quickly quenched.

To operate as a semiconductor junction diode, different regions of the diode must be doped with dopants of opposite conductivity types, like the n-type region 112 and the p-type region 116 of the diodes of FIG. 6c. It might be expected that when the silicon of the diode 118 is melted, the dopants in these doped regions will diffuse, and the dopant profile necessary to maintain the diode will be lost.

In the present invention, however, the initial defect density, dopant profile, semiconductor volume, programming voltage, programming time, and other factors combine to form an advantageous and novel memory cell, in which the diode retains good non-ohmic behavior after programming, and remains a high-quality diode.

As described, titanium-nitride-contact diodes, which have been formed with high defect density, behave very differently before and after programming. A clear structural change after programming is not apparent in TEM images, however. Programmed titanium-nitride-contact diodes remain polycrystalline (not single-crystal) and do not appear nearly defect-free, as silicide-contact diodes do, as in FIG. 9.

To explore the degree of physical change in the programmable diode of the present invention, an array of cells was formed like the memory level of titanium-nitride contact cells shown in FIG. 6c. The cells in the memory were programmed in a checkerboard pattern. The top conductors were removed by CMP, and the diodes and intervening dielectric exposed.

Figure 11:
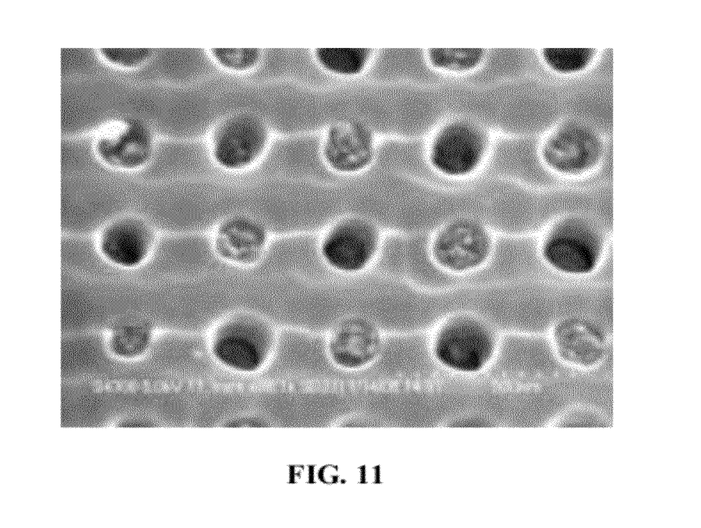
FIG. 11 is a SEM image showing preferential etching of unprogrammed diodes in a memory level of the present invention.

It is known that a Secco solution etches silicon with defects faster than silicon without defects. The exposed diodes were exposed to a Secco solution for two seconds. Referring to the scanning electron microscope (SEM) image of FIG. 11, the unprogrammed cells were entirely etched away, while the programmed cells remain. It is apparent, then, that the physical structure of polysilicon of the diodes was changed by programming.

As noted earlier, the programmed titanium-nitride-contact diode has a barrier height profile strongly resembling that of the silicide-contact diode as formed, which has low defect density and a more highly ordered crystalline structure. After programming, the diode becomes more resistant to Secco solution, an etchant that prefers defective silicon. It is thus believed that the crystalline structure of the polycrystalline semiconductor material of the diode becomes more highly ordered after programming. These changes in crystallinity, while apparently too subtle or too localized to be evident in TEM images, make a large difference in diode performance.

An antifuse is an element in a circuit that initially impedes current flow until, when subjected to high voltage, it permanently changes its nature, allowing current flow; this is opposite the operation of a fuse. The device of Johnson et al. included a diode and a dielectric antifuse layer in series. The diode of Johnson et al. was generally crystallized in contact with titanium silicide, and thus was low-resistance as formed, so the device depended on dielectric rupture of the dielectric antifuse layer.

In both the cell of Johnson et al. and in the cell of the present invention, the data state of the memory cell is determined by a state of an antifuse. In Johnson et al., the antifuse was a dielectric antifuse layer, generally a silicon dioxide layer in series with a diode. In the present invention, in contrast, the polycrystalline semiconductor junction diode itself is the antifuse.

To improve uniformity, it may be preferred in some embodiments of the present invention to include a thin dielectric layer such as silicon dioxide or some other appropriate dielectric material disposed between the diode and the top or the bottom conductor. Nonetheless, in such a cell the memory state of the cell is determined by the state of the polycrystalline semiconductor material, which is either programmed or unprogrammed.

It is possible that other elements, such as barrier layers, etc., disposed between the diode of the present invention and the top or bottom conductor may experience some incidental change in resistivity when a programming voltage is applied between the top and bottom conductors. In preferred aspects of the invention, it is nonetheless the change in resistivity of the material of the diode that predominates.

In these preferred aspects, a memory cell is formed by forming a first conductor; forming a second conductor; depositing and doping semiconductor material to form a semiconductor junction diode, the semiconductor junction diode disposed between the first and second conductors; crystallizing the semiconductor material such that the semiconductor junction diode is polycrystalline, wherein, during the crystallizing step, the semiconductor material is not in contact with a template material having a lattice mismatch of less than 12 percent with the semiconductor material; and programming the memory cell by applying a programming voltage between the first and second conductors, wherein no resistance-switching element having its resistance changed by application of the programming voltage by more than a factor of two is disposed between the semiconductor junction diode and the first conductor or between the semiconductor junction diode and the second conductor.

In preferred embodiments, the memory cell of the present invention does not comprise an additional resistance changing element, such as a dielectric antifuse layer or a chalcogenide material.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

In preferred embodiments, a monolithic three dimensional memory array of the present invention include: a) a first memory level above a substrate, the first memory level comprising: i) a first plurality of substantially parallel conductors; ii) a second plurality of substantially parallel conductors above the first conductors; iii) a first plurality of semiconductor junction diodes, each first diode disposed between one of the first conductors and one of the second conductors; and iv) a first plurality of one-time-programmable memory cells, each first memory cell adapted to be programmed by application of a programming voltage, each memory cell comprising a portion of one of the first conductors, a portion of one of the second conductors, and one of the first diodes, wherein before programming, each first diode has a first maximum barrier height, and after programming, each first diode has a second maximum barrier height, the second maximum barrier height at least 1.5 times the first maximum barrier height; and b) a second memory level monolithically formed above the first memory level.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A memory cell comprising:
a first conductor;
a second conductor;
a semiconductor junction diode between the first and second conductors,
wherein:
the semiconductor junction diode is not in contact with a material having a lattice mismatch of less than 12 percent with the semiconductor junction diode, and
no resistance-switching element having its resistance changed by application of a programming voltage by more than a factor of two is disposed between the semiconductor junction diode and the first conductor or between the semiconductor junction diode and the second conductor.

2. The memory cell of claim 1, wherein the semiconductor junction diode comprises silicon, germanium, or a silicon-germanium alloy.

3. The memory cell of claim 1, wherein the memory cell does not comprise a dielectric antifuse layer.

4. The memory cell of claim 1, wherein the memory cell does not comprise a chalcogenide material.

5. The memory cell of claim 1, wherein the semiconductor junction diode is not in contact with a material having a lattice mismatch of less than 4 percent with the semiconductor junction diode.

6. The memory cell of claim 1, further comprising a layer of titanium nitride, tungsten nitride, tantalum nitride, tantalum, tungsten, or titanium tungsten in contact with the semiconductor junction diode.

7. The memory cell of claim 1, wherein the semiconductor junction diode is not in contact with titanium silicide, cobalt silicide, or nickel monosilicide.

8. The memory cell of claim 1, wherein, before programming, the semiconductor junction diode has a first maximum barrier height, and after programming, the semiconductor junction diode has a second maximum barrier height, the second maximum barrier height at least 1.5 times the first maximum barrier height.

9. A method comprising:
forming a semiconductor junction diode between first and second conductors;
crystallizing the semiconductor junction diode, wherein during the crystallizing step, the semiconductor junction diode is not in contact with a template material having a lattice mismatch of less than 12 percent with the semiconductor junction diode; and
programming the memory cell by applying a programming voltage between the first and second conductors,
wherein no resistance-switching element having its resistance changed by application of the programming voltage by more than a factor of two is disposed between the semiconductor junction diode and the first conductor or between the semiconductor junction diode and the second conductor.

10. The method of claim 9, wherein the semiconductor junction diode comprises silicon, germanium, or a silicon-germanium alloy.

11. The method of claim 9, wherein the memory cell does not comprise a dielectric antifuse layer.

12. The method of claim 9, wherein the memory cell does not comprise a chalcogenide material.

13. The method of claim 9, wherein, during the crystallization step, the semiconductor junction diode is not in contact with a template material having a lattice mismatch of less than 4 percent with the semiconductor junction diode.

14. The method of claim 9, wherein, during the crystallizing step, the semiconductor junction diode is in contact with titanium nitride, tungsten nitride, tantalum nitride, tantalum, tungsten, or titanium tungsten.

15. The method of claim 9, wherein, during the crystallizing step, the semiconductor junction diode is not in contact with titanium silicide, cobalt silicide, or nickel monosilicide.

16. The method of claim 9, wherein, before the programming step, the semiconductor junction diode has a first maximum barrier height, and after the programming step, the semiconductor junction diode has a second maximum barrier height, the second maximum barrier height at least 1.5 times the first maximum barrier height.

17. A monolithic three dimensional memory array comprising:
(a) a first memory level above a substrate, the first memory level comprising:
i) a first plurality of substantially parallel conductors;
ii) a second plurality of substantially parallel conductors above the first plurality of substantially parallel conductors; and
iii) a first plurality of pillars comprising semiconductor junction diodes, each pillar disposed between one of the first plurality of substantially parallel conductors and the second plurality of substantially parallel conductors,
wherein:
each semiconductor junction diode is not in contact with a material having a lattice mismatch of less than 12 percent with the semiconductor junction diode, and
no resistance-switching element having its resistance changed by application of a programming voltage by more than a factor of two is disposed between any of the semiconductor junction diodes and the first plurality of substantially parallel conductors or the second plurality of substantially parallel conductors; and (b) a second memory level monolithically formed above the first memory level.

18. The monolithic three dimensional memory array of claim 17, wherein the semiconductor junction diodes comprise silicon, germanium, or a silicon-germanium alloy.

19. The monolithic three dimensional memory array of claim 17, wherein the semiconductor junction diodes comprise vertically oriented p-i-n diodes.

20. The monolithic three dimensional memory array of claim 17, wherein the second memory level comprises a second plurality of pillars comprising semiconductor junction diodes.

* * * * *